United States Patent [19]

Caratsch

[11] 4,408,560

[45] Oct. 11, 1983

[54] APPARATUS FOR APPLYING SOLDER TO PRINTED CIRCUIT BOARDS

[75] Inventor: Hans-Peter Caratsch, Bremgarten, Switzerland

[73] Assignee: Sinter Limited, Bristol, England

[21] Appl. No.: 193,099

[22] Filed: Oct. 2, 1980

[30] Foreign Application Priority Data

Nov. 2, 1979 [CH] Switzerland ............... 9846/79

[51] Int. Cl.³ .................... B05C 3/09; B23K 31/02
[52] U.S. Cl. .................... 118/69; 118/74; 118/425; 118/503; 134/68; 134/134; 198/413; 271/225; 271/185; 228/47; 228/180 R; 228/259
[58] Field of Search ........... 118/69, 74, 122, 423, 118/425, 427, 500, 503; 228/40, 47, 180 R, 259; 271/66, 70, 72, 83, 184, 185, 225; 29/840, 860, 879; 427/98, 933; 134/68, 134; 198/413

[56] References Cited

U.S. PATENT DOCUMENTS

| | | | |
|---|---|---|---|
| 1,164,277 | 12/1915 | Forsstrom | 198/413 X |
| 2,347,608 | 4/1944 | Owen | 134/134 X |
| 2,803,216 | 8/1957 | Termini et al. | 118/423 |
| 3,056,371 | 10/1962 | Frank | 228/259 X |
| 3,273,572 | 9/1966 | Schwarze et al. | 134/134 X |
| 3,680,762 | 8/1972 | Kondo | 29/840 X |
| 4,232,066 | 11/1980 | Stevens et al. | 118/425 X |

FOREIGN PATENT DOCUMENTS 1771792 1/1972 Fed. Rep. of Germany .
484983 5/1938 United Kingdom .

*Primary Examiner*—John D. Smith
*Assistant Examiner*—Bernard F. Plantz
*Attorney, Agent, or Firm*—Werner W. Kleeman

[57] ABSTRACT

Printed circuit boards which are to be tin-plated pass through a liquid application station in a horizontal direction, and thereafter through an activation station for the activation of the applied liquid. Then the printed circuit boards arrive at a receiver element of substantially U-shaped cross-sectional configuration, which subsequently is pivoted about a horizontal pivot shaft, out of a horizontal take-up position into a vertical transfer position. During this pivotal movement the printed circuit board bears upon a support element or part which supports the printed circuit board. By means of grippers the printed circuit board, previously brought by the receiver element into a vertical position, is immersed in vertical position into a solder bath. After a certain residence time the printed circuit board is inserted by the gripper into a further receiver element likewise having a U-shaped cross-sectional configuration, this receiver element being located in a vertical receiving position. Then, this further receiver element is pivoted about a horizontal pivot axis into a horizontal transfer position where the printed circuit board is placed upon an outfeed conveyor which transfers such printed circuit board to a sieve transport belt which moves the printed circuit board through a cooling station. During pivoting of the further receiver element, from the vertical into the horizontal position, the printed circuit board bears upon a support element which continuously supports the printed circuit board during its transport. The printed circuit board which softens within the solder bath, due to this supporting action of the support element, is prevented from deforming during such time as it is transferred from the vertical into the horizontal position.

23 Claims, 4 Drawing Figures

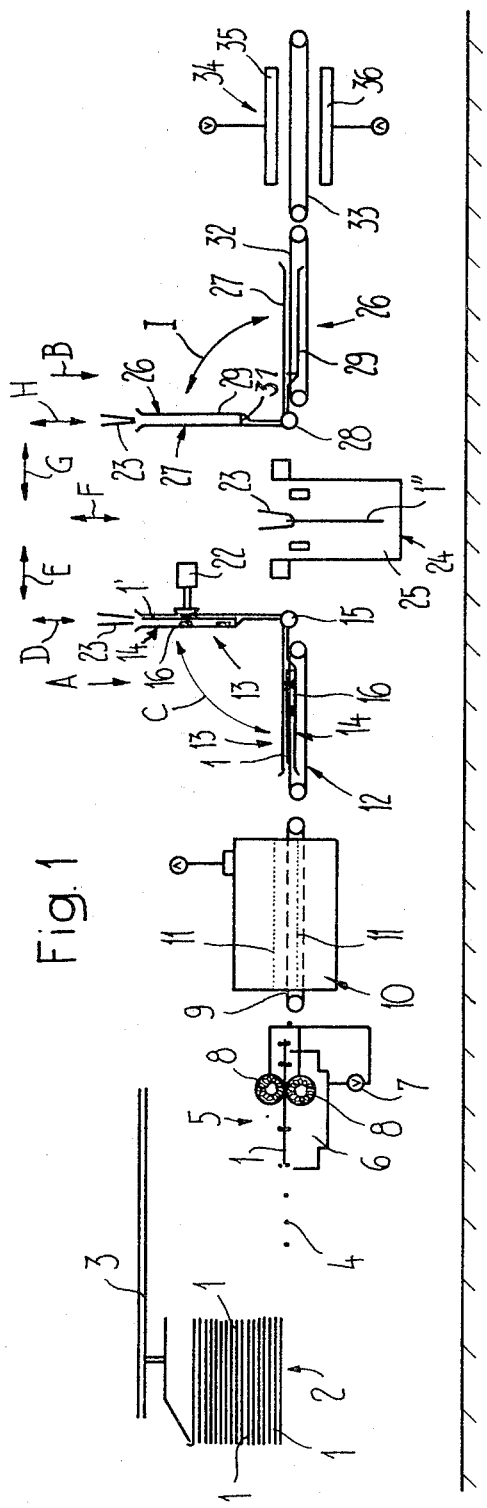
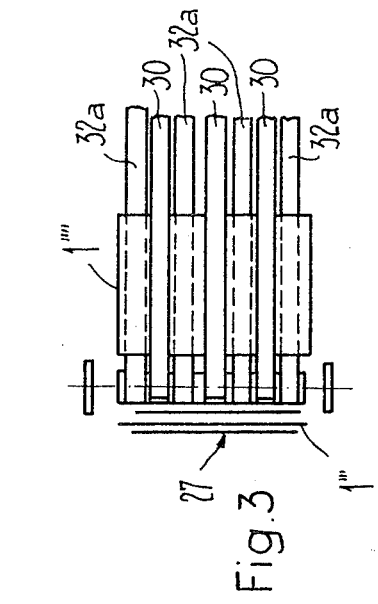
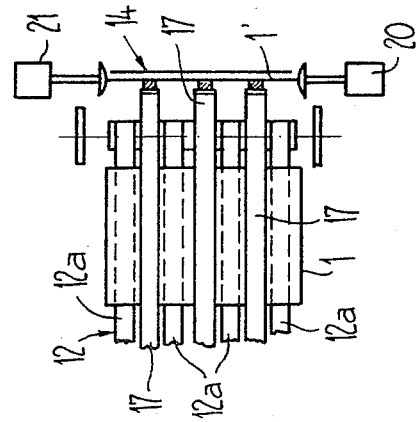

APPARATUS FOR APPLYING SOLDER TO PRINTED CIRCUIT BOARDS

BACKGROUND OF THE INVENTION

The present invention relates to a new and improved construction of apparatus for applying solder to printed circuit boards.

Generally speaking, the solder application apparatus of the present development is of the type comprising a solder bath into which there are immersed the printed circuit boards in essentially vertical direction.

It is known to the art to subject printed circuit boards containing a conductive path or pattern formed of bear copper to a hot tin-plating process, wherein by immersing the printed circuit boards into a tin bath the molten solder (a lead-tin alloy, normally the eutectic alloy tin-lead 63/37) directly acts upon the copper. After a certain period of time the printed circuit boards are withdrawn out of the hot tin bath and brought out of their vertical position into a horizontal position, where the solder can soldify. Since the carrier material of the printed circuit board, for instance an epoxy resin, is heated within the solder bath up to its softening temperature, the printed circuit board is extremely soft after departing from the solder bath. Therefore, the printed circuit board, during the transfer from the vertical into the horizontal position, tends to deform.

SUMMARY OF THE INVENTION

It is a primary object of the present invention to provide an efficient apparatus of the previously mentioned type wherein such deformation of the printed circuit boards is avoided during their entire treatment duration.

Now in order to implement this object and others which will become more readily apparent as the description proceeds, the solder application apparatus of the present development is of the type comprising a holder or receiver device for receiving the printed circuit boards departing from the solder bath and transferring such into an essentially horizontal position. The holder device contains a support element upon which bear the printed circuit boards during their transfer into the horizontal position.

After the departure of the printed circuit board out of the solder bath this printed circuit board is taken-up in vertical position by the holder device and brought by the latter into a horizontal position. The support element continuously supports the printed circuit board during its transport, so that there is effectively avoided any deformation of such printed circuit board.

According to a preferred construction of the invention, it is contemplated to arrange forwardly of the solder bath a device for applying a liquid. The printed circuit boards move through such liquid-applying device in essentially horizontal direction. Between this liquid-applying device and the solder bath there is arranged a transport device for transferring the printed circuit boards from their essentially horizontal position into an essentially vertical position. This transport device likewise continuously supports the printed circuit boards during their transport, so that there is avoided deformation of printed circuit boards which likewise have become soft during passage through the liquid-applying device.

BRIEF DESCRIPTION OF THE DRAWINGS

The invention will be better understood and objects other than those set forth above, will become apparent when consideration is given to the following detailed description thereof. Such description makes reference to the annexed drawings wherein:

FIG. 1 is a purely schematic side view of an apparatus for tin-plating printed circuit boards;

FIG. 2 is a top plan view, on an enlarged scale in relation to FIG. 1, of the transport device of the arrangement of FIG. 1, looking in the direction of the arrow A thereof;

FIG. 3 is a top plan view, again on an enlarged scale in relation to FIG. 1, of the holder device of such apparatus of FIG. 1, looking in the direction of the arrow B thereof.

DETAILED DESCRIPTION OF THE PREFERRED EMBODIMENTS

Figure 4:
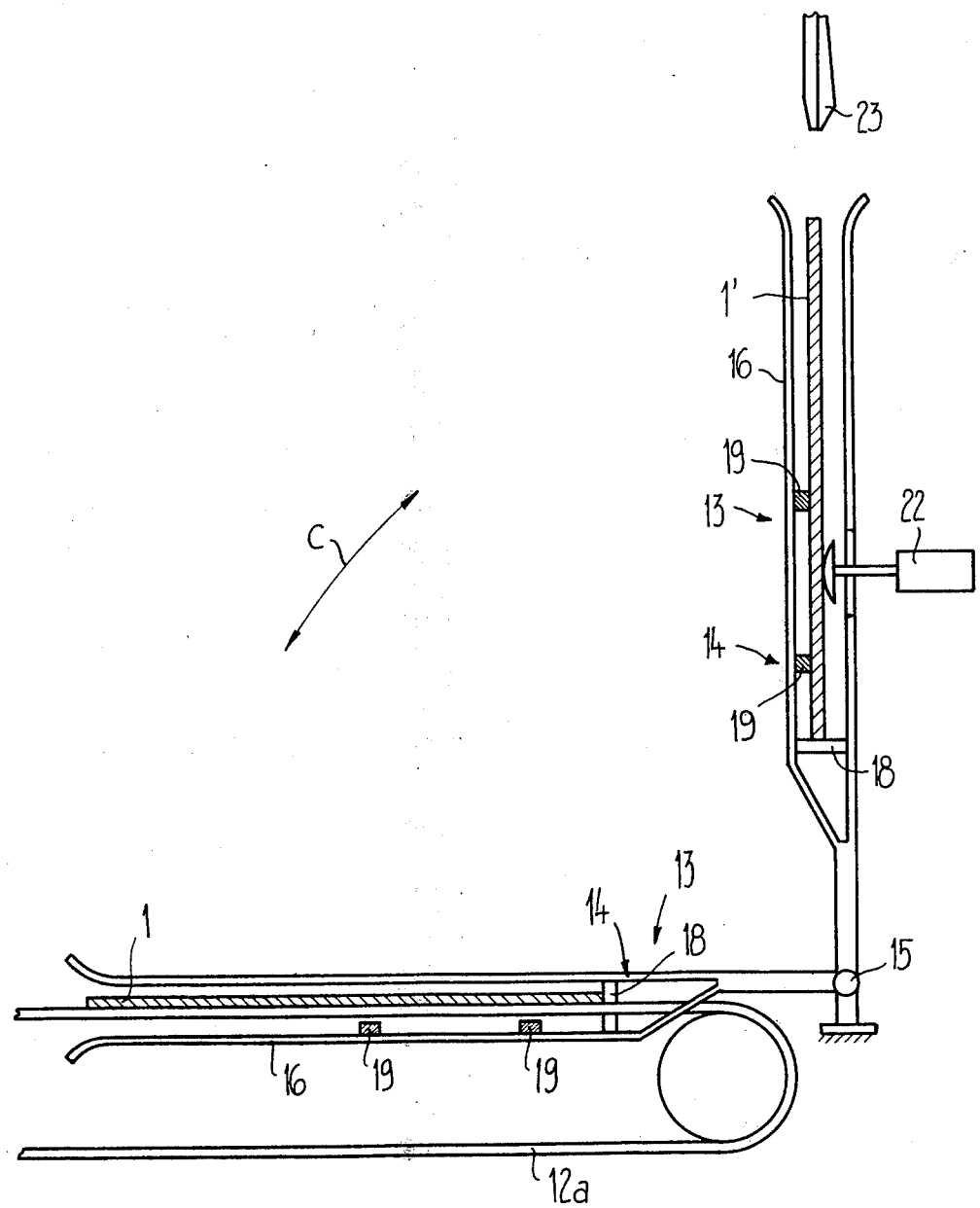
FIG. 4 illustrates in side view, again on an enlarged scale in relation to the illustrations of FIGS. 1 to 3, of the transport device.

Describing now the drawings, based upon the showing of FIGS. 1 to 4 there will be considered the construction and mode of operation of the tin-plating apparatus for printed circuit boards. Under the expression "tinning" or "tin-plating", as employed herein, there is to be understood not only the application of a lead-tin alloy, but also any other suitable type of solder.

As best seen by referring to FIG. 1, the printed circuit boards 1 which are to be treated, which are provided with a suitable conductive pattern and, for instance, used for printed circuits, are placed upon one another into a stack 2. The uppermost printed circuit board 1 of the stack 2 is placed by means of a suitable lifting device 3, which can be equipped for instance with a suitable suction head, upon the conveyor rolls 4 which transport the printed circuit boards through a liquid-applying station 5. This liquid-applying station 5, which is of known design, possesses a vat or receptical 6 containing a suitable liquid. This liquid is conveyed by means of a pump 7 to two oppositely situated applicator elements 8, between which pass the printed circuit boards 1. By means of these applicator elements 8 there is applied the liquid to the printed circuit board 1. The printed circuit boards 1 departing from the liquid-applying station 5, arrive at a transport band or belt 9 or equivalent structure, which conveys the printed circuit boards 1 through an activation station 10. At this activation station 10 there are arranged two oppositely situated rows of infrared radiating devices 11 between which passes the printed circuit board 1. By means of these infrared radiating devices 11 the printed circuit boards 1 are heated at both faces or sides. Such heating causes activation of the applied liquid. The heating temperature, which is dependent upon the employed liquid, in the embodiment under discussion, amounts to for instance about 120° C.

From the transport band 9 the printed circuit boards 1 arrive at an infeed device 12 which is constituted by individual conveyor belts or bands 12a extending essentially parallel to one another and arranged at a mutual spacing from one another, as best seen by referring to FIG. 2. The printed circuit boards reposing upon the infeed device 12 are delivered to a transport device 13 having a receiver element 14 of substantially U-shaped configuration in cross-section. This receiver element or receiver 14 is pivotable about a substantially horizontal pivot shaft 15 from a receiving or take-up position, where it extends essentially in horizontal direction, into a transfer position where it assumes an essentially vertical direction, as best seen for instance by referring to FIG. 4. The one wall 16 of the receiver element or receiver 14 serves as the support element or part for the printed circuit board 1 located upon the receiver element 14. As best seen by referring to FIG. 2, both oppositely situated walls, in other words in particular the wall 16 forming the support element, are constituted by individual rods 17 extending parallel to one another and at a mutual spacing from one another. These rods 17 are offset in relation to the conveyor belt 12a of the infeed device 12, so that this conveyor belt 12a can engage, in the take-up or receiving position of the receiver element 14, between the rods 17 of the support element or part 16. At such receiving or take-up position of the receiver element 14 the conveying-active run of the conveyor belt 12a extends between the rods 17 of both walls of the receiver element 14, as particularly well seen by referring to FIG. 4. The printed circuit board 1 bearing upon the conveyor belts 12a therefore extends into the receiver element 14 located in the horizontal receiving or take-up position, until it bears against a stop or impact member 18 of the receiver element 14. The wall of the receiver element 14 which forms the support part or element 16 is provided at its inner situated side with two support elements 19 upon which come to bear the printed circuit boards 1 during the pivoting of the receiver element 14.

As will be seen by referring to FIG. 2, there are provided two oppositely situated lateral or side alignment devices 20 and 21 which are effective upon the side edges of the printed circuit board 1' in the vertical take-up or receiving position of the receiver element 14, in order to exactly laterally align such printed circuit board 1' at the lengthwise axis of the equipment. Furthermore, there is provided a lengthwise alignment device 22 which is effective at one plate side or face of the printed circuit board 1' and presses such against the aforementioned stop or impact elements 19 at the support element 16 of the receiver element 14. In this way the printed circuit board 1' is also positioned in the lengthwise axis of the equipment.

In order to lift-out the printed circuit boards 1' from the receiver element 14 there are provided the schematically illustrated grippers or gripper elements 23 which, in a manner more fully to be explained hereinafter, bring the printed circuit boards 1 from the receiver element 14 to a tin-plating station 24. This tin-plating station 24 contains a solder bath into which there can be immersed the printed circuit boards while in a vertical position, as the same has been illustrated for the printed circuit board designated by reference character 1" in FIG. 1. The tin-plating station 24 may be of known construction and can be designed, for instance, in the manner described in the granted U.S. Pat. No. 3,865,298, issued Feb. 11, 1975.

Continuing, this tin-plating station 24 has arranged thereafter a holder device 26 which can be similarly constructed as the transport device 13. This holder device 26 likewise has a receiver element 27 having a substantially U-shaped cross-sectional configuration. This receiver element 27 can be pivoted about a pivot shaft 28 from a vertical receiving position into a horizontal transfer position. One of both oppositely situated walls of the receiver element 27 is constructed as a support element or part 29, by means of which the printed circuit boards are supported during the pivoting of the receiver element 27. Both of the walls of the receiver element 27, and particularly the support element 29, are formed by rods or rod members 30 which extend parallel to one another and are arranged at a mutual spacing from one another, as particularly evident from the illustration of FIG. 3. The receiver element 27 is additionally provided with a stop or impact member 31 against which bear the printed circuit boards.

For removing the printed circuit boards 1'''' out of the receiver element 27 located at the transfer position, there is beneficially provided an outfeed device or conveyor 32 which is similarly constructed as the infeed device 12. This outfeed conveyor 32 thus likewise contains parallel and mutually spaced conveyor belts or bands 32a, which extend at the transfer location of the receiver element 27 between the rods 30 of the support element 29.

The printed circuit boards 1'''' which have been received by the outfeed conveyor 32 or equivalent structure are transferred to a sieve-transport band 33 which travels through a cooling station 34. This cooling station 34 possesses two oppositely situated cooling air units 35 and 36 between which travel the printed circuit boards for the purpose of cooling the same.

Now there will be considered the mode of operation of the equipment described above, to the extent that such operation is not already apparent from the previous discussion.

The printed circuit boards which depart from the activation station 10 are infed by means of the infeed device 12 to the receiver element 14 which is located in a horizontal receiving or take-up position, as will be apparent from FIG. 4. As soon as the arriving printed circuit boards 1 impact against the stop member 18 of the receiver element 14 then the receiver element 14 is pivoted about the pivot shaft 15 in the direction of the arrow C into its vertical transfer position. As soon as the receiver element 14 has reached this transfer position, then there is accomplished a lateral alignment of the printed circuit board, designated by reference character 1', with respect to the lengthwise axis of the equipment, by the action of the lateral or side aligning devices 20 and 21. Moreover, due to pressing of the printed circuit board 1' against the support elements 19 by means of the lengthwise or longitudinal alignment device 22 there is accomplished positioning of such printed circuit board along the lengthwise axis of the equipment. In this manner there is carried out an extremely accurate alignment of the printed circuit board 1' with respect to the lengthwise axis of the equipment. Such alignment of the printed circuit board 1' is necessary, in order to insure for exact insertion of the printed circuit board into the tin plating or tinning station 24.

After completion of the alignment of the printed circuit board 1' the gripper 23 is moved downwardly in the direction of the arrow D and engages such printed circuit board 1'. This gripper mechanism is constructed such that it can faultlessly seize printed circuit boards of different height. Thereafter, the gripper 23 together with the engaged printed circuit board 1' is moved in the direction of the arrow D upwardly, and then, in the direction of the arrow E in horizontal direction over the tinning station 24. As soon as the printed circuit board 1' has been removed out of the receiver element 14, then such is rocked in the direction of the arrow C again into the horizontal receiving or take-up position, in order to be able to be charged with a new printed circuit board.

As soon as the gripper 23 together with the seized printed circuit board 1 is located at the central axis of the tin-plating station 24, then the gripper or gripper element 23 moves in the direction of the arrow F downwardly and immerses the printed circuit board 1" into the solder bath 25. Throughout a certain time, for instance about 3 to 6 seconds, this printed circuit board 1" remains within the solder bath 25 which, for instance, can be at a temperature of about 230° C. to 250° C. Due to this residence of the printed circuit board 1" in the hot solder bath 25 the substrate or carrier material of the printed circuit board 1" is softened, so that there exists the danger of deformation of the printed circuit board during the subsequent treatment operation.

After expiration of the mentioned time span the gripper 23 is moved upwardly in the direction of the arrow F, and thus, the printed circuit board 1" is withdrawn out of the solder bath 25. At the same time the holes located in the printed circuit board 1" are blown with hot air, as the same has been described in such previously mentioned U.S. Pat. No. 3,865,298. The temperature of the out blown air advantageously is maintained between 100° C. and 120° C. The blowing nozzles used for this purpose are advantageously pivotable, so that depending upon the nature of the printed circuit board, it is possible to regulate the spacing between the nozzle mouths and the printed circuit boards.

If the gripper 23 has reached its highest point, then, it is then moved in the direction of the arrow G along the lengthwise axis of the equipment, until it is disposed over the receiver element 27 located in the receiving position. Now the gripper 23 is lowered in the direction of the arrow H, and thus, the printed circuit board is introduced into the interior of the receiver element 27. As soon as the printed circuit board bears against the stop or impact member 31, then the gripper 23 releases such printed circuit board and travels back to the receiving element 14, in order to take-over the next printed circuit board which has been infed therefrom and to deliver such in the described manner to the tinning or tin-plating station 24.

As soon as the printed circuit board is located in the receiver element 27, then such is rocked in the direction of the arrow I about the pivot shaft 28 into the horizontal transfer position. As soon as the rods 30 of the support element 29 travel between the conveyor belts 32a of the outfeed device 32, the printed circuit board 1"" (FIG. 3) comes to bear upon such conveyor belts or bands 32a and is infed thereby to the sieve-transport band 33. The printed circuit board which reposes upon such sieve-transport band 33 now is impinged at both faces with cooling air at the cooling station 34, for instance with ambient air, and in this way is then cooled. After departing from the cooling station 34 the finished tin-plated printed circuit boards can be removed from the transport band 33.

Due to the construction of the holder device 26 there is avoided deformation of the soft printed circuit boards during the transfer from the vertical into the horizontal position in that, during such transport the printed circuit boards bear upon the support element or part 29 and are continuously supported by such support element. Since the printed circuit boards are supported by the conveyor belts or bands 32a and the sieve-transport band 33 also during the transport in horizontal direction, these printed circuit boards can be guided through the cooling station 34 and cooled without the same becoming distorted.

Depending upon the thickness of the printed circuit boards and the used supporting or substrate material, it is possible that the printed circuit boards also tend to soften during their passage through the infrared radiation or radiating devices 11 of the activation station 10. The described construction of the transport device 13 prevents that in such case there will arise any deformation of the printed circuit boards during their transport. This is achieved in that the printed circuit boards 1, during the transfer from the horizontal into the vertical position, continuously bear upon the supporting element or support part 16, and thus, are supported by this component.

While there are shown and described present preferred embodiments of this invention, it is to be distinctly understood that the invention is not limited thereto, but may be otherwise variously embodied and practiced within the scope of the following claims. Accordingly,

What I claim is:

1. Apparatus for applying solder simultaneously to both sides of printed circuit boards, comprising:
   means for holding a liquid solder bath;
   means for moving the essentially vertically oriented circuit boards into and out of said solder bath;
   a holder device having a substantially U-shaped cross-sectional configuration for receiving the printed circuit boards removed from the solder bath by said moving means and for transferring said boards into an essentially horizontal position;
   said holder device being movable between a receiving position where such holder device receives the essentially vertically oriented printed circuit boards and a transfer position where the printed circuit boards are arranged in an essentially horizontal plane; and
   said holder device being provided with support element means upon which the printed circuit boards bear during their transfer into the horizontal position.

2. The apparatus as defined in claim 1, further including:
   means for mounting said holder device to be pivotable about an essentially horizontal shaft between said receiving position and said transfer position.

3. Apparatus for applying solder simultaneously to both sides of printed circuit boards, comprising:
   means for holding a liquid solder bath;
   means for moving the essentially vertically oriented circuit boards into and out of said solder bath;
   a holder device for receiving the printed circuit boards removed from the solder bath by said moving means and for transferring said boards into an essentially horizontal position;
   support element means provided for said holder device upon which the printed circuit boards bear during their transfer into the horizontal position;
   means for mounting said holder device to be pivotable about an essentially horizontal shaft between a receiving position where such holder device receives the printed circuit boards extending essentially in vertical direction and a transfer position where the printed circuit boards are arranged in an essentially horizontal plane;

said holder device comprises a receiver element having a substantially U-shaped cross-sectional configuration;

said receiver element in a receiving position thereof for the printed circuit boards extending essentially in vertical direction and in a transfer position thereof extending essentially in horizontal direction; and said receiver element forming a wall of said support element.

4. Apparatus for applying solder simultaneously to both sides of printed circuit boards, comprising:

means for holding a liquid solder bath;

means for moving the essentially vertically oriented circuit boards into and out of said solder bath;

a holder device having a substantially U-shaped cross-sectional configuration for receiving the printed circuit boards removed from the solder bath by said moving means and for transferring said boards into an essentially horizontal position;

support element means provided for said holder device upon which the printed circuit boards bear during their transfer into the horizontal position;

said support element comprises mutually spaced and essentially parallel extending rod members;

an outfeed conveyor containing transport bands extending essentially parallel to one another in a transfer position; and said transport bands engaging between said rod members in said transfer position.

5. The apparatus as defined in claim 4, further including:

a transport element provided with openings and arranged following said outfeed conveyor; and a cooling station through which travels said transport element.

6. The apparatus as defined in claim 1, further including:

means arranged forwardly of said solder bath for applying a liquid;

said printed circuit boards passing in essentially horizontal direction through said liquid-applying means;

a transport device arranged between said liquid-applying means and the solder bath for transferring the printed circuit boards from their essentially horizontal position into an essentially vertical position.

7. The apparatus as defined in claim 6, wherein:

said transport device contains a support portion upon which bear the printed circuit boards during transport thereof.

8. The apparatus as defined in claim 7, further including:

means defining a substantially horizontal shaft about which said transport device is pivotable between a take-up position where it receives the printed circuit boards infed essentially in horizontal direction and a transfer position where the printed circuit boards extend in an essentially vertical plane.

9. Apparatus for applying solder simultaneously to both sides of printed circuit boards, comprising:

means for holding a liquid solder bath;

means for moving the essentially vertically oriented circuit boards into and out of said solder bath;

a holder device for receiving the printed circuit boards removed from the solder bath by said moving means and for transferring said boards into an essentially horizontal position;

support element means provided for said holder device upon which the printed circuit boards bear during their transfer into the horizontal position;

means arranged forwardly of said solder bath for applying a liquid;

said printed circuit boards passing in essentially horizontal direction through said liquid-applying means;

a transport device arranged between said liquid-applying means and the solder bath for transferring the printed circuit boards from their essentially horizontal position into an essentially vertical position;

said transport device contains a support portion upon which bear the printed circuit boards during transport thereof;

means defining a substantially horizontal shaft about which said transport device is pivotable between a take-up position where it receives the printed circuit boards infed essentially in horizontal direction and a transfer position where the printed circuit boards extend in an essentially vertical plane;

said transport device comprises a receiver element having a substantially U-shaped cross-sectional configuration;

said receiver element in the take-up position extending essentially in horizontal direction and in the transfer position extending essentially in vertical direction; and said receiver element forming a wall of said support portion.

10. Apparatus for applying solder simultaneously to both sides of printed circuit boards, comprising:

means for holding a liquid solder bath;

means for moving the essentially vertically oriented circuit boards into and out of said solder bath;

a holder device having a substantially U-shaped cross-sectional configuration for receiving the printed circuit boards removed from the solder bath by said moving means and for transferring said boards into an essentially horizontal position;

support element means provided for said holder device upon which the printed circuit boards bear during their transfer into the horizontal position;

means arranged forwardly of said solder bath for applying a liquid;

said printed circuit boards passing in essentially horizontal direction through said liquid-applying means;

a transport device arranged between said liquid-applying means and the solder bath for transferring the printed circuit boards from their essentially horizontal position into an essentially vertical position;

said transport device contains a support portion upon which bear the printed circuit boards during transport thereof;

said support portion comprises rod members arranged at a mutual spacing from one another and essentially parallel to one another;

an infeed means arranged following the liquid-applying means;

said infeed means comprising a plurality of mutually parallel transport bands; and said rod members extending between said transport bands in the take-up position.

11. An apparatus for applying solder to printed circuit boards, comprising:
 means for holding a liquid solder bath into which the printed circuit boards are immersed essentially in vertical direction;
 means for moving the essentially vertically oriented circuit boards into and out of said solder bath;
 a holder device having a substantially U-shaped cross-sectional configuration for receiving the printed circuit boards departing from the solder bath and for transferring such into an essentially horizontal position;
 a support element provided for said holder device upon which bear the printed circuit boards during their transfer into the horizontal position;
 means arranged forwardly of said solder bath for applying a liquid;
 said printed circuit boards passing in essentially horizontal direction through said liquid-applying means;
 a transport device arranged between said liquid-applying means and the solder bath for transferring the printed circuit boards from their essentially horizontal position into an essentially vertical position;
 said transport device contains a support portion upon which bear the printed circuit boards during transport thereof;
 means defining a substantially horizontal shaft about which said transport device is pivotable between a take-up position where it receives the printed circuit boards infed essentially in horizontal direction and a transfer position where the printed circuit boards extend in an essentially vertical plane; and
 an alignment device, which in the transfer position of the transport device, laterally acts upon the printed circuit boards engaged by the transport device in order to laterally align said printed circuit boards.

12. The apparatus as defined in claim 11, further including:
 an additional alignment device, which in the transfer position of the transport device acts transversely with respect to a plane of the printed circuit boards engaged by the transport device and upon said printed circuit boards, in order to press said printed circuit boards against support elements arranged at said support portion.

13. An apparatus for applying solder to printed circuit boards, comprising:
 means for holding a liquid solder bath into which the printed circuit boards are immersed essentially in vertical direction;
 means for moving the essentially vertically oriented circuit boards into and out of said solder bath;
 a holder device for receiving the printed circuit boards departing from the solder bath and for transferring such into an essentially horizontal position;
 a support element provided for said holder device upon which bear the printed circuit boards during their transfer into the horizontal position;
 means arranged forwardly of said solder bath for applying a liquid;
 said printed circuit boards passing in essentially horizontal direction through said liquid-applying means;
 a transport device arranged between said liquid-applying means and the solder bath for transferring the printed circuit boards from their essentially horizontal position into an essentially vertical position; and
 said moving means comprises gripper means for moving the printed circuit boards from the transport device located in the transfer position to the solder bath and from the latter to the holder device located in the receiving position.

14. An apparatus for applying solder to a printed circuit board, comprising:
 means defining a solder bath into which immerse the printed circuit boards in essentially vertical direction;
 means arranged forwardly of the solder bath for applying a liquid to the printed circuit boards;
 a transport device arranged between said liquid-applying means and said solder bath;
 a holder device having a substantially U-shaped cross-sectional configuration serving for receiving the printed circuit boards removed from the solder bath and for transferring said boards into an essentially horizontal position; and
 said transport device receiving the printed circuit boards which pass through the liquid-applying means in essentially horizontal direction and transferring such printed circuit boards into an essentially vertical position.

15. The apparatus as defined in claim 14, wherein:
 said transport device is provided with support means upon which bear the printed circuit boards during their transport.

16. The apparatus as defined in claim 8, further including:
 an alignment device, which in the transfer position of the transport device, laterally acts upon the printed circuit boards engaged by the transport device in order to laterally align said printed circuit boards.

17. The apparatus as defined in claim 16, further including:
 an additional alignment device, which in the transfer position of the transport device acts transversely with respect to a plane of the printed circuit boards engaged by the transport device and upon said printed circuit boards, in order to press said printed circuit boards against support elements arranged at said support portion.

18. The apparatus as defined in claim 6, further including:
 gripper means for moving the printed circuit boards from the transport device located in the transfer position to the solder bath and from the latter to the holder device located in the receiving position.

19. The apparatus as defined in claim 2, wherein:
 said holder device comprises a receiver element having said substantially U-shaped cross-sectional configuration;
 said receiver element in a receiving position thereof for the printed circuit boards extending essentially in vertical direction and in a transfer position thereof extending essentially in horizontal direction; and
 a wall of said receiver element forming said support element.

20. The apparatus as defined in claim 1, wherein:
 said support element comprises mutually spaced and essentially parallel extending rod members;

an outfeed conveyor containing transport bands extending essentially parallel to one another in a transfer position; and said transport bands engaging between said rod members in said transfer position.

21. The apparatus as defined in claim 20, further including:

a transport element provided with openings and arranged following said outfeed conveyor; and a cooling station through which travels said transport element.

22. The apparatus as defined in claim 8, wherein:

said transport device comprises a receiver element having a substantially U-shaped cross-sectional configuration;

said receiver element in the take-up position extending essentially in horizontal direction and in the transfer position extending essentially in vertical direction; and said receiver element forming a wall of said support portion.

23. The apparatus as defined in claim 7, wherein:

said support portion comprises rod members arranged at a mutual spacing from one another and essentially parallel to one another;

an infeed means arranged following the liquid-applying means;

said infeed means comprising a plurality of mutually parallel transport bands; and said rod members extending between said transport bands in the take-up position.

* * * * *